United States Patent [19]

Duthie et al.

[11] Patent Number: 4,821,150
[45] Date of Patent: Apr. 11, 1989

[54] PRINTED CIRCUIT BOARD MOUNTING FOR COMMUNICATION TERMINATION

[75] Inventors: George A. Duthie; Mark C. Frey, both of Chantilly; Wilfred L. Gleadall, Waterford, all of Va.; Ambroz C. Skrovanek, Bethesda, Md.; David O. Corp, Sterling, Va.

[73] Assignee: Hubbell Incorporated, Orange, Conn.

[21] Appl. No.: 176,250

[22] Filed: Mar. 31, 1988

[51] Int. Cl.[4] ............................................. H05K 1/14
[52] U.S. Cl. ..................................... 361/395; 361/399; 361/415; 361/428; 379/327; 379/399
[58] Field of Search ................ 361/380, 391, 393–395, 361/399, 413, 415, 426–429; 379/326–328, 387, 399

[56] References Cited

U.S. PATENT DOCUMENTS

| | | | |
|---|---|---|---|
| 2,777,893 | 1/1957 | De Rosso | 174/52 |
| 3,200,361 | 8/1965 | Schwartz et al. | 339/17 |
| 3,546,539 | 12/1970 | Wilcox, Jr. et al. | 317/101 |
| 3,644,792 | 2/1972 | Fields | 317/101 |
| 3,676,746 | 7/1972 | Kassabgi et al. | 317/101 |
| 4,152,750 | 5/1979 | Bremenour et al. | 361/393 |
| 4,333,696 | 6/1982 | O'Neill et al. | 339/17 |
| 4,490,775 | 12/1984 | Quan | 361/406 |

FOREIGN PATENT DOCUMENTS

| | | | |
|---|---|---|---|
| 2846825 | 5/1980 | Fed. Rep. of Germany | 379/328 |
| 3331797 | 3/1985 | Fed. Rep. of Germany | 361/415 |

*Primary Examiner*—A. D. Pellinen
*Assistant Examiner*—Gregory D. Thompson
*Attorney, Agent, or Firm*—Jerry M. Presson; Walter C. Farley

[57] ABSTRACT

A communications termination structure includes a printed circuit board having a front panel with a cable opening and a modular jack receptacle. The board carries all components necessary to accomplish a termination and also carries a rear edge connector and a terminal strip. Groups of terminals on the terminal strip and on the edge connector are interconnected and the modular jack receptacle is similarly connected to a group of terminals on each of those connectors. The board can be independently mounted in a simple housing and wired from the front using the terminal strip and modular jack receptacle. Alternatively, a plurality of such boards can be mounted, without modification, in a rack having a plurality of receptacles for such boards.

6 Claims, 4 Drawing Sheets

PRINTED CIRCUIT BOARD MOUNTING FOR COMMUNICATION TERMINATION

This invention relates to a mounting system for a telephone communication printed circuit board which permits economical expansion and interchangeable mounting of the board in multiple environments.

BACKGROUND OF THE INVENTION

In the context of telephone termination equipment, it is necessary to provide at the termination location a printed circuit board which has circuit components to handle the signals, to provide for certain test functions, and, generally, to provide the interface between a customer's (user's) equipment and the local telephone equipment. The circuits provided on these printed circuit boards can vary somewhat, depending on the specific use. The circuits themselves are conventional and do not form part of the present invention.

The manner in which the boards are employed depends upon the number of boards needed in a specific location. Each board normally has an edge connector along a rear edge of the board. If only one board is needed, as is often the case, the board is mounted in its own housing which contains a receptacle to receive the edge connector. The receptacle is mounted on a separate PC board, fixedly mounted at the rear of the housing, which can also have a terminal strip mounted on it. A rear wall of the housing is provided with connectors so that the fixed printed circuit board can be connected to wires leading to the telephone company equipment and user's equipment.

If the customer's needs are larger so that two or more boards are needed for a larger number of terminations, the boards are commonly mounted on a rack or mounting shelf which has a back plane printed circuit board with sockets to receive all of the boards. The wire connections to the users' equipment and also to the telephone company equipment are then made to the back plane. It should be noted that each termination generally requires its own printed circuit board. Commonly, these boards are associated with four-wire dedicated telephone lines to permit synchronous or asynchronous duplex communication.

When a customer starts out with one or two terminations and thus has one or two printed circuit boards mounted in individual housings and then later requires multiple printed circuit boards, it is presently common practice to remove the boards from their housings and plug them into the back plane sockets of a shelf or rack. The individual housings are then no longer usable. They are, however, quite expensive because they include the fixed printed circuit board, the components mounted thereon, and also the various connectors mounted on the printed circuit board as well as in the rear wall of the housing. Because of the cost of these housing assemblies, the housings are either discarded at considerable loss or, more frequently, an effort is made to test, refurbish and return each housing to inventory for future use. However, this "recycling" process is, in itself, a costly one.

SUMMARY OF THE INVENTION

Accordingly, an object of the present invention is to provide a printed circuit board structure which carries it own termination connectors usable to connect the board to the customer's equipment and the telephone company equipment directly, whether used alone or in conjunction with other boards.

A further object is to provide a board which can be employed in a simple, inexpensive housing which has no auxiliary electronic or electrical fittings and which can be discarded or reused without testing or refurbishing.

Briefly described, the invention involves a communication termination apparatus including a generally rectangular printed circuit board having electric circuit means thereon for forming an interface between internal (customer) and external (telephone company) communication lines at a termination location. Means along a rear edge of the printed circuit board defines an edge connector having a plurality of conductive members electrically connected to circuit components on the board, first and second groups of the conductive members being designated, respectively, for connection to internal and external communication lines. A front panel is attached to the front edge of the printed circuit board, the front panel being perpendicular to the plane containing the board. A second connector is mounted on the board for connection to said communication lines, the second connector having a plurality of terminals in third and fourth groups electrically connected, respectively, to the first and second groups of conductive members. A third connector is mounted on the front panel, the third connector having a plurality of terminals electrically connected to the first group of conductive members and connectable to the internal communication lines. The board can thus be installed in a simple, five-sided housing and connected to the communication lines using the second and third connectors or, alternatively, the board can be mounted with other similar boards in a rack having receptacles for the edge connectors.

BRIEF DESCRIPTION OF THE DRAWINGS

In order to impart full understanding of the manner in which these and other objects are attained in accordance with the invention, particularly advantageous embodiments thereof will be described with reference to the accompanying drawings, which form a part of this specification, and wherein.

DESCRIPTION OF THE PREFERRED EMBODIMENTS

Figure 1:
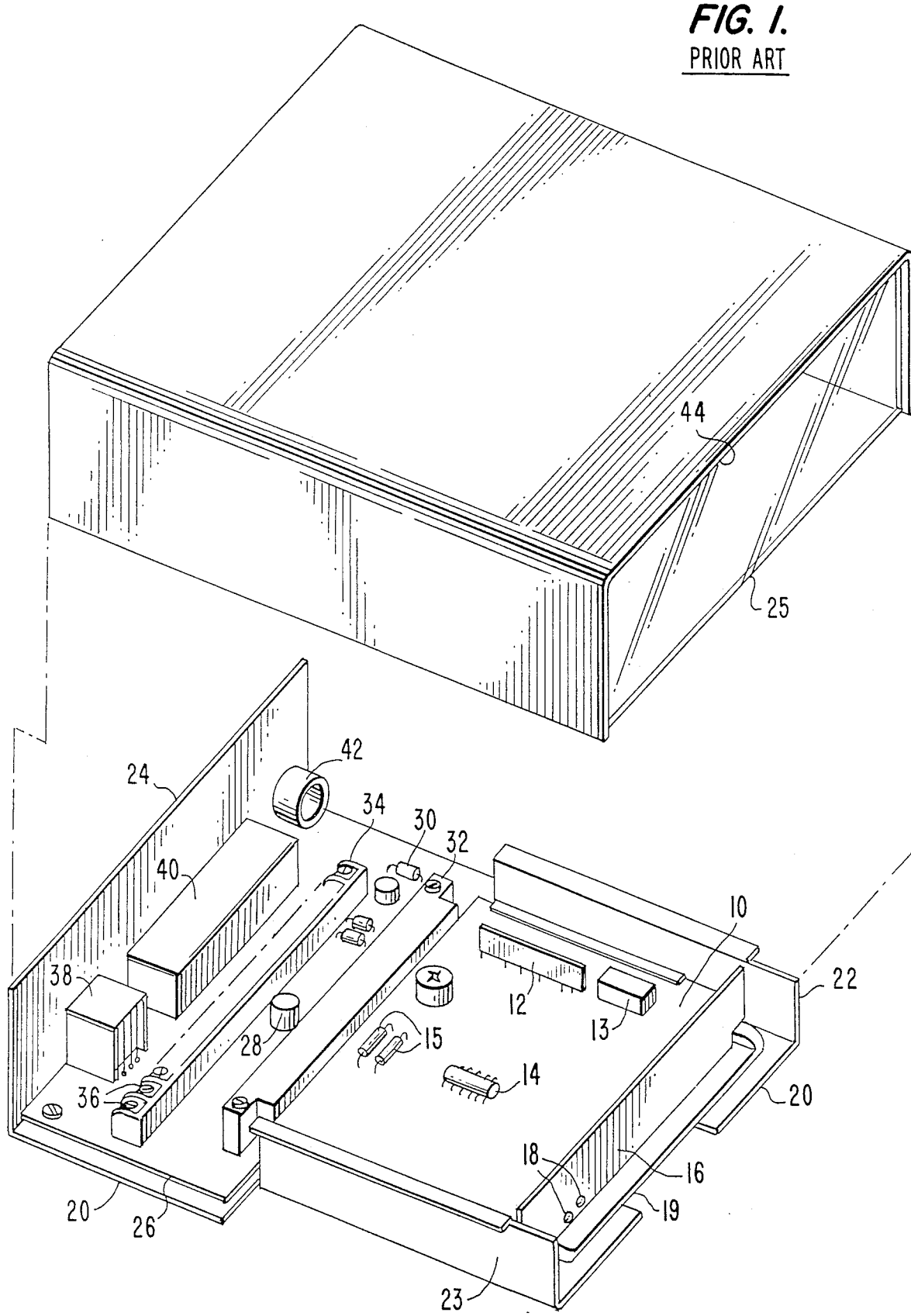
FIG. 1 is a perspective view of a prior art termination structure.

FIG. 1 shows a prior art housing for a printed circuit board for a termination of the type with which the present invention is concerned. The structure includes the printed circuit board 10 having various electronic components 12, 13, 14, and 15 mounted thereon, these components being interconnected in a well-understood manner to form the termination for a communications line. Typically, the printed circuit board components constitute impedance matching and amplifying circuits to handle a four-wire, duplex dedicated line for data communication, although there are many variations on that possibility. Printed circuit board 10 is fixedly attached to a front panel 16 which may have indicator lights 18 thereon and may also have switches or the like, depending upon the function of the board. A handle 19 is fixedly attached to the front panel and the board to permit insertion and extraction of the board from the housing.

The housing itself includes a sheet metal or plastic structure having a floor 20, side walls 22 and 23, a rear wall 24. An additional printed circuit board 26 is mounted at the rear portion of the housing and carries various circuit components 28,30 for operation in conjunction with the circuit components carried by board 10.

Of particular importance, printed circuit board 26 carries a receptacle 32 designed to receive an edge connector formed along the rear edge of circuit board 10, the connector not being visible in FIG. 1 because it is inserted within the receptacle. Conductive paths, formed in a conventional fashion, along the printed circuit board connect the conductive portions of receptacle 32 to other regions on the board.

Printed circuit board 26 also commonly carries a terminal strip 34 having a plurality of terminals 36 to which wires can be attached. In addition, connectors 38 and 40 are mounted at the juncture between printed circuit board 26 and rear wall 24, the connectors having openings through the rear wall so that mating plug connectors can be inserted into the receptacle connectors 38 and 40 to make connection with components on the boards. A tubular grommet 42 is also mounted in rear wall 24 so that a cable can pass through wall 24, permitting the wires in the cable to be connected to appropriate terminals 36 on terminal strip 34. Finally, a housing cover 44 is placed over the lower portion of the housing assembly to close the structure and form a relatively dust-free and protected environment for the circuit components. Cover 44 carries a transparent front wall 25 which permits viewing of indicator lights 18 on front panel 16.

Typically, the structure of FIG. 1 is placed in an office or other termination location near the equipment with which it will be used. Receptacle connector 38 is commonly an RJ type modular connector to receive a telephone plug from the users' equipment. Receptacle connector 40 can be used to connect to the local telephone company equipment and the various circuit components and conductive paths on the board are used to connect these receptacles to board 10. Alternatively, a cable can extend inwardly through grommet 42 to connect to selected ones of terminals 36. This portion of the connection can be used in place of connecting the wires through plug connectors to receptacle connectors 38 or 40.

As previously indicated, an arrangement of the type shown in FIG. 1 is employed if the user has need for one or possibly two, separate line terminations. However, for a larger number, a box-like housing is used in which a plurality of receptacles are mounted in the back of the housing on a back plane, allowing a plurality of printed circuit boards to be inserted therein and plugged into the connectors. If the user initially has housings such as those shown in FIG. 1 and then must expand to the shelf or rack type of mounting, board 10 is extracted from each such housing and inserted into the rack. The remainder of the housing, including the metal portions thereof as well as printed circuit board 26 and all of the associated components and connectors are no longer usable at that location and must be tested, refurbished and restocked in inventory, a costly process.

Figure 2:
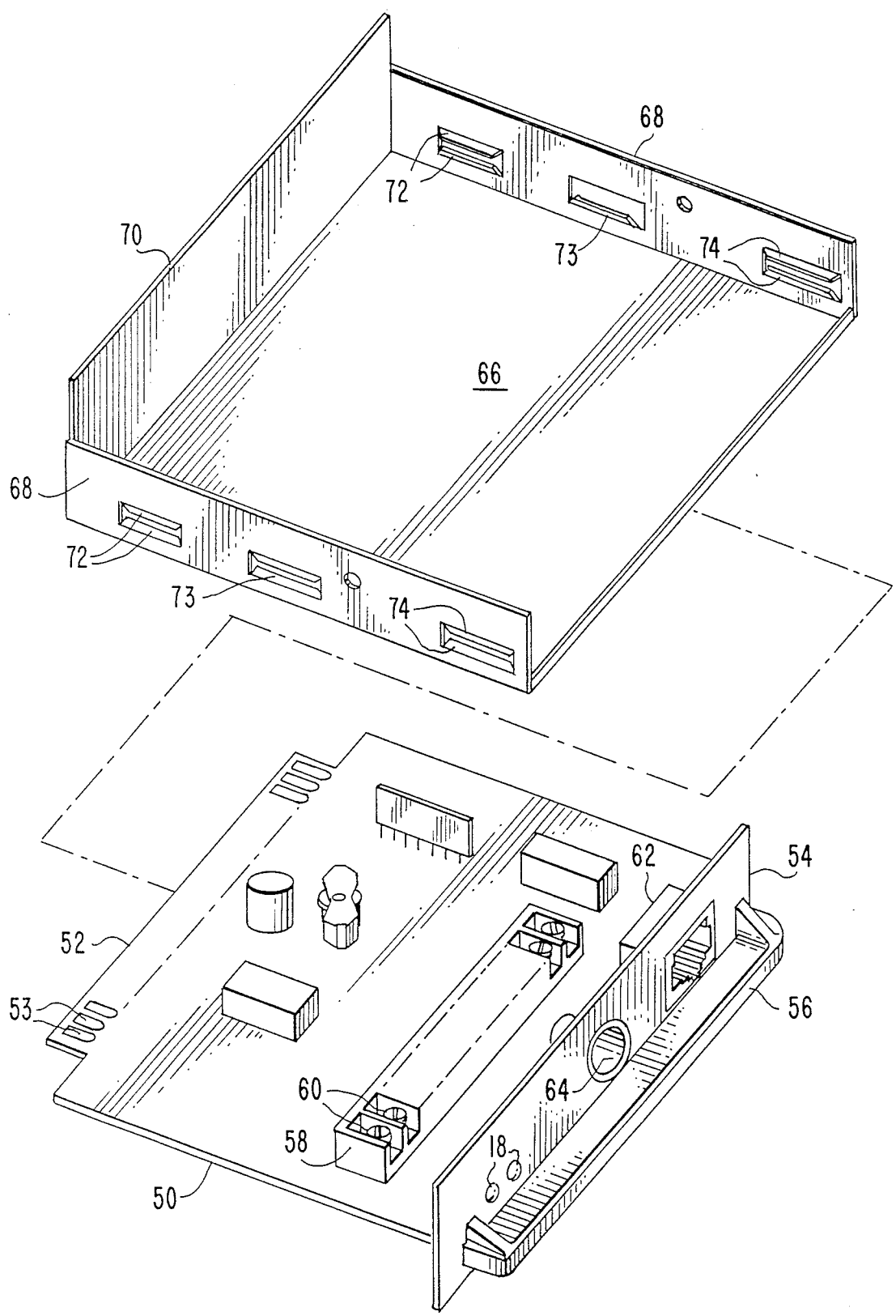
FIG. 2 is an exploded perspective view of a printed circuit board structure in accordance with the invention shown in conjunction with a portion of the housing usable therewith.
Figure 3:
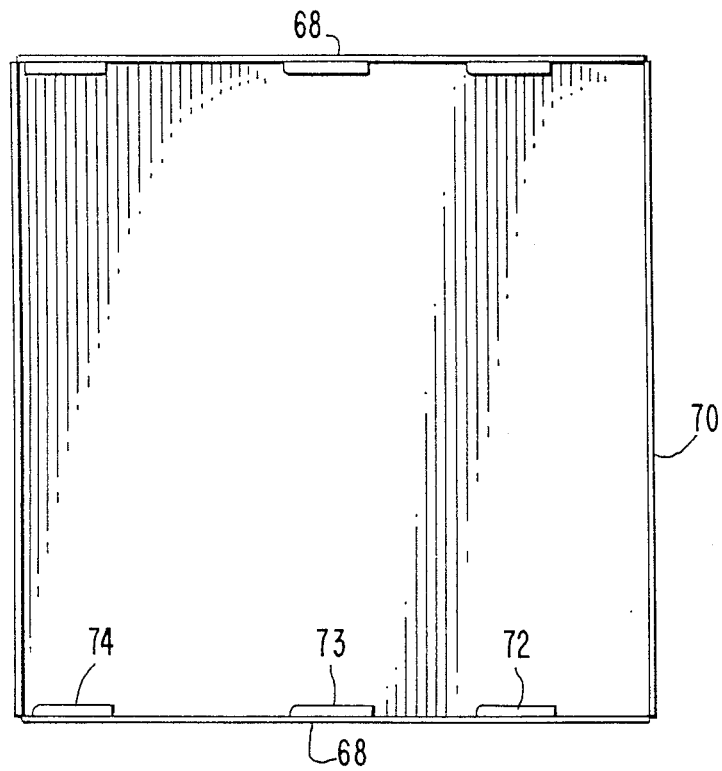
FIGS. 3 and 4 are top plan and side elevation views, respectively, of the housing portion shown in FIG. 2.

FIG. 2 shows an arrangement in accordance with the present invention in which a printed circuit board 50 is provided with a plurality of circuit components for properly terminating a multiple-wire communications line, including those circuit components which would have been used on circuit board 10 and also the components of printed circuit board 26. At the rear edge of printed circuit board 50 is an edge connector 52 having a plurality of conductive members 53 positioned, in a conventional fashion, for making proper connection when inserted into a mating receptacle connector. At the front edge of board 50 is a front panel 54 which is fixedly mounted to the board. A handle 56 is fixedly attached to board 50 and panel 54 so that the structure can be inserted or withdrawn as a unit.

Of particular significance is the provision of a terminal strip 58 on board 50, strip 58 having a plurality of screw terminals 60 to which wires can be attached. Also, front panel 54 may be provided with an opening for access to an RJ type modular connector 62 having terminals 65, mounted on board 50 and also an opening having a grommet 64 through which a cable can be inserted.

The assembly including board 50, front panel 54 and handle 56, with the associated connectors and circuit components can be inserted into a housing, the lower portion of which is shown in the upper portion of FIG. 2, this housing comprising a simple, sheet-metal structure having a bottom wall 66, opposite side walls 68 and a rear wall 70. Side walls 68 are provided with pairs of inwardly struck portions 72,74 to receive opposite edges of board 50.

It will be observed that when the assembly including board 50 is inserted into the lower housing portion shown in FIG. 2, edge connector 52 is not used. The edge connector is formed so that the conductive portions or members 53 thereon do not extend completely to the rear edge of the non-conductive substrate so that even if the edge of the connector comes in contact with rear wall 70, conductive portions 53 thereof will not make electrical connection with the rear wall of the housing. Alternatively, the housing can be made of non-conductive plastic.

Rather, all connections are made through the front panel. Conveniently, the user's equipment can be connected to the circuit components on board 50 through terminals 65 of RJ connector 62. Alternatively, the connections to the user's equipment can be made by passing a cable through the grommet 64 and connecting individual wires of the cable to selected terminals 60 of terminal strip 58. Similarly, the telephone company equipment can be connected to the board by passing a cable through grommet 64 and connecting the wires to the appropriate terminals on terminal strip 58. As many as three separate cables can pass through grommet 64, one for the user's equipment, one for the telephone company equipment and a third to supply power and ground connections if those are not already supplied in the other two cables.

Figure 4:
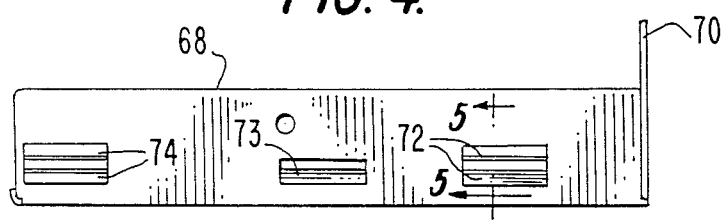
Figure 5:
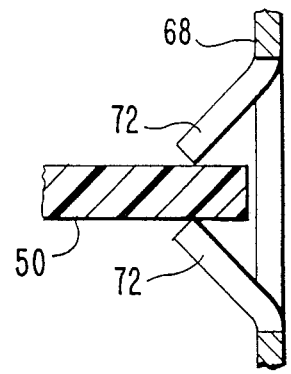
FIG. 5 is an enlarged partial sectional view along line 5—5 of FIG. 4.
Figure 6:
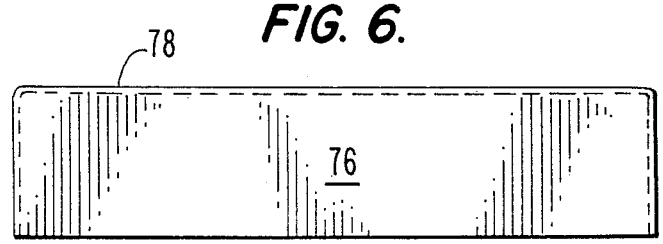
FIGS. 6 and 7 are side and front elevations, respectively, of the cover portion of the housing for the structure of FIG. 2.
Figure 7:
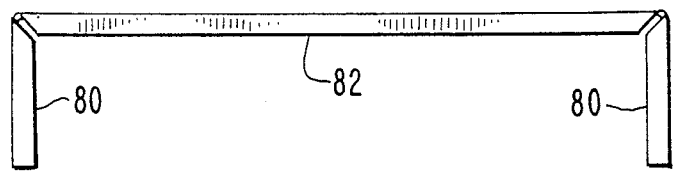

The housing details are shown somewhat more clearly in FIGS. 3-7, FIGS. 3 and 4 showing the bottom portion of the housing seen in the upper part of FIG. 2 and FIGS. 6 and 7 showing a simple, U-shaped cover which can be placed over the top of the housing forming a five-sided enclosure. When inserted, panel 54 connected to board 50 forms the sixth side of the housing, completing the enclosure.

As seen in FIG. 4 and in greater detail in FIG. 5, the inwardly struck portions 72 form a guide for board 50, the cover includes side panels 76, a top portion 78, and inwardly extending flanges 80 at the edges of the side walls and a downwardly extending flange 82 along the edges of the top wall. The cover is simply slipped downwardly over the lower portion of the housing.

Figure 8:
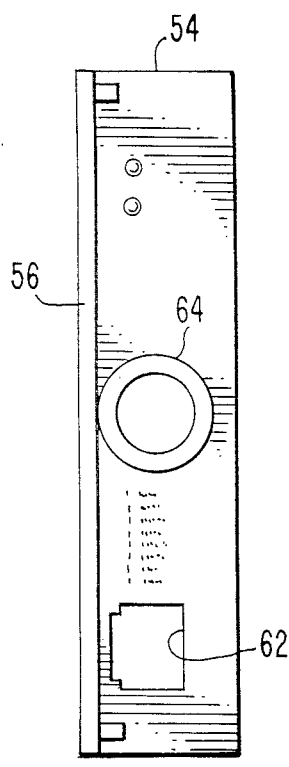
FIGS. 8 and 9 are front elevation and top plan views, respectively, of the printed circuit board and front panel structure in accordance with the invention.
Figure 9:
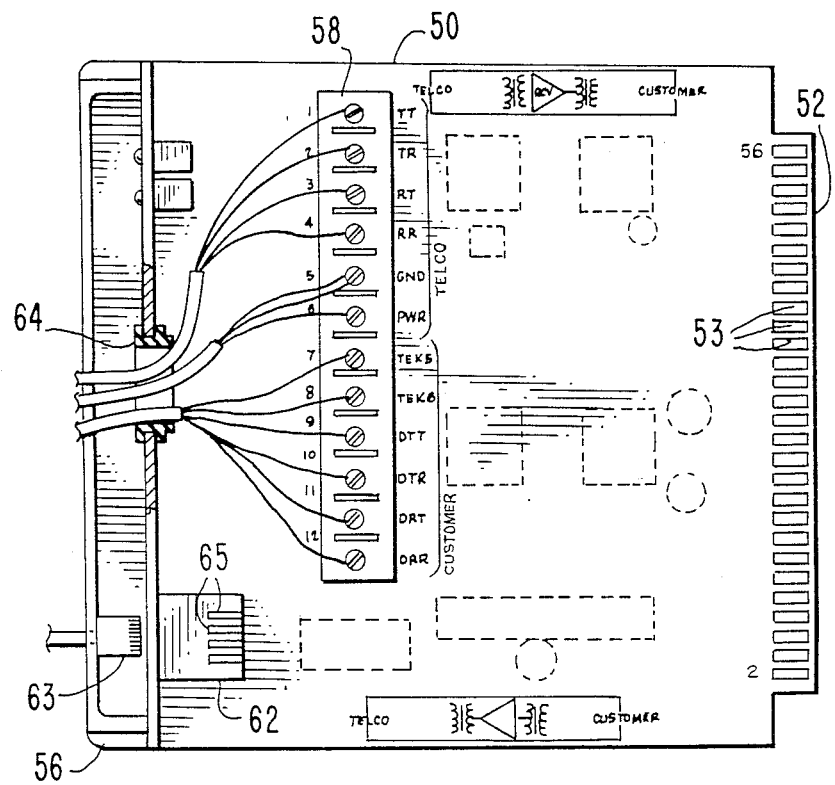

The arrangement of the printed circuit board and a front elevation of the front panel are shown in FIGS. 8 and 9. As will be recognized, the terminals of terminal strip 58 are separated into groups and each group is electrically connected, by conductive paths formed on the printed circuit board, with corresponding first and second groups of conductive members 53 in edge connector 52. Each group is additionally-connected to the appropriate circuit components. Similarly, RJ connector 62, positioned to receive a mating plug 63, is connected to not only the corresponding groups in terminal strip 58 and edge connector 52, but also the appropriate circuit components. Thus, regardless of whether the user's equipment is connected to the board using connector 62, terminal strip 58 or edge connector 52, the equipment is electrically connected to the same set of components mounted on the board and to the appropriate internal communication lines.

Figure 10:
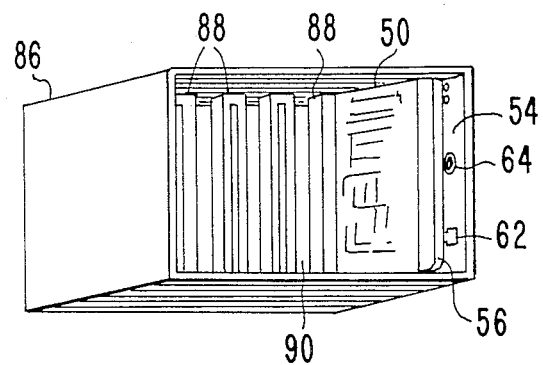
FIG. 10 is a perspective view of a rack or shelf arrangement for receiving printed circuit boards in accordance with FIGS. 8 and 9.

FIG. 10 shows a perspective view of a housing 86 forming a shelf or rack mounting for a plurality of circuit boards 50. A single board 50 is shown mounted in the housing, edge connector 52 thereof being plugged into a mating receptacle connector 88 which is physically mounted on a back plane 90 of the housing. The back plane can be provided with printed circuit conductive paths and the back face of the case is provided with terminal strips for connection to local and telephone equipment. The housing includes a plurality of receptacle connectors 88 constituting means to receive other boards, the number of receptacles and the size of the arrangement being determined solely by the anticipated number of terminations required.

While it is anticipated that a mounting in a shelf or rack arrangement such as that shown in FIG. 10 would involve using the edge connector and wiring from the rear of the housing, using back plane 90, it is also possible to use front wiring through grommet 64 and RJ connector 62 in this arrangement as well. Thus, the printed circuit board structure of he present invention provided maximum flexibility and adaptability to a wide variety of termination circumstances with maximum economy and with minimum labor in the rearrangement and connection of facilities when such is necessary.

While certain advantageous embodiments have been chosen to illustrate the invention, it will be understood by those skilled in the art that various changes and modifications can be made therein without departing from the scope of the invention as defined in the appended claims.

What is claimed is:

1. Communication termination apparatus comprising a generally rectangular printed circuit board having electrical circuit means thereon for forming an interface between internal and external communication lines at a termination location;

means defining a first edge connector along a rear edge of said printed circuit board, said edge connector having a plurality of conductive members electrically connected to circuit components on said board, first and second groups of said conductive members being designated, respectively, for connection to internal and external communication lines;

a front panel attached to a front edge of said printed circuit board opposite said rear edge, said front panel being perpendicular to the plane containing said board;

means defining a second connector on said board for connection to said communication lines, said second connector having a plurality of terminals in third and fourth groups electrically connected to said first and second groups of conductive members, respectively; and means defining a third connector on said front panel, said third connector having a plurality of terminals electrically connected to said first group of conductive members and connectable to said internal communication lines, said board being selectively installable in one of a five-sided housing and a rack having edge connector receptacles, said board being connectable to said communication lines in said housing using said second and third connectors and in a rack using receptacles for said edge connector.

2. An apparatus according to claim 1 wherein said front panel includes means defining an opening to allow a cable to pass therethrough to said second connector.

3. An apparatus according to claim 2 wherein said second connector comprises a terminal strip.

4. An apparatus according to claim 3 wherein said third connector comprises a type RJ modular connector.

5. An apparatus according to claim 1 wherein said third connector comprises a type RJ modular connector.

6. Communication termination apparatus comprising a generally rectangular printed circuit board having electrical circuit means thereon for forming an interface between internal and external communication lines at a termination location;

means defining a first edge connector along a rear edge of said printed circuit board, said edge connector having a plurality of conductive members electrically connected to circuit components on said board, first and second groups of said conductive members being designated, respectively, for connection to internal and external communication lines;

a front panel attached to a front edge of said printed circuit board opposite said rear edge, said front panel being perpendicular to the plane containing said board;

means defining a second connector on said board for connection to said communication lines, said second connector having a plurality of terminals in third and fourth groups electrically connected, respectively, to said first and second groups of conductive members;

means defining a third connector on said front panel, said third connector having a plurality of terminals electrically connected to said first group of conductive members and connectable to said internal communication lines, a five-sided, generally rectangular housing dimensioned to receive side printed circuit board with said front panel forming and substantially closing a sixth side of said housing; and a rack mount including means for receiving a plurality of printed circuit boards, said means for receiving including receptacles, said board being selectively installable in either of said five-sided housing or a rack mount and being connectable to said communication lines using said second and third connectors in the housing or in said rack mount using one of said receptacles with said edge connector.

* * * * *